United States Patent
Wang et al.

(10) Patent No.: US 11,211,254 B2
(45) Date of Patent: Dec. 28, 2021

(54) PROCESS FOR INTEGRATED CIRCUIT FABRICATION USING A BUFFER LAYER AS A STOP FOR CHEMICAL MECHANICAL POLISHING OF A COUPLED DIELECTRIC OXIDE LAYER

(71) Applicant: STMicroelectronics Pte Ltd, Singapore (SG)

(72) Inventors: Yuzhan Wang, Singapore (SG); Pradeep Basavanahalli Kumarswamy, Singapore (SG); Hong Kia Koh, Singapore (SG); Alberto Leotti, Singapore (SG); Patrice Ramonda, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 17/096,434

(22) Filed: Nov. 12, 2020

(65) Prior Publication Data
US 2021/0193476 A1  Jun. 24, 2021

Related U.S. Application Data

(60) Provisional application No. 62/950,316, filed on Dec. 19, 2019.

(51) Int. Cl.
*H01L 21/3105* (2006.01)
*H01L 21/762* (2006.01)
*H01L 21/768* (2006.01)

(52) U.S. Cl.
CPC .. *H01L 21/31055* (2013.01); *H01L 21/76229* (2013.01); *H01L 21/76819* (2013.01); *H01L 21/76802* (2013.01)

(58) Field of Classification Search
None
See application file for complete search history.

(56) References Cited

U.S. PATENT DOCUMENTS

| | | | |
|---|---|---|---|
| 6,025,279 A | 2/2000 | Chiang et al. | |
| 6,180,509 B1 * | 1/2001 | Huang | H01L 21/76885 438/624 |
| 6,707,134 B1 * | 3/2004 | Li | H01L 21/31053 257/637 |
| 7,838,427 B2 | 11/2010 | Chang | |
| 2008/0113512 A1 | 5/2008 | Kim | |
| 2017/0117356 A1 * | 4/2017 | Carothers | H01L 23/5226 |

* cited by examiner

*Primary Examiner* — Andres Munoz
(74) *Attorney, Agent, or Firm* — Crowe & Dunlevy

(57) ABSTRACT

A first dielectric layer made of a first dielectric material is deposited over a semiconductor substrate. A buffer layer is then deposited on an upper surface of the first dielectric layer. A trench is opened to extend through the buffer layer and the first dielectric layer. A second dielectric layer made of a second dielectric material is the deposited in a conformal manner on the buffer layer and filling the trench. Chemical mechanical polishing of the second dielectric layer is performed to remove overlying portions of the second dielectric layer with the buffer layer being used as a polish stop. After removing the buffer layer, the first dielectric layer and the second dielectric material filling the trench form a pre-metallization dielectric layer having a substantially planar upper surface.

25 Claims, 5 Drawing Sheets

PROCESS FOR INTEGRATED CIRCUIT FABRICATION USING A BUFFER LAYER AS A STOP FOR CHEMICAL MECHANICAL POLISHING OF A COUPLED DIELECTRIC OXIDE LAYER

CROSS REFERENCE TO RELATED APPLICATION

This application claims priority from U.S. Provisional Application for Patent No. 62/950,316 filed Dec. 19, 2019, the disclosure of which is incorporated by reference.

TECHNICAL FIELD

The present invention generally relates to the fabrication of integrated circuits and, in particular, to the chemical mechanical polishing (CMP) of a coupled dielectric oxide layer to form a pre-metallization dielectric (PMD) layer having a planar top surface.

BACKGROUND

With reference to FIG. 1A, it is known in art of fabricating integrated circuits to deposit a layer 10 of a dielectric material (for example, an oxide) over a semiconductor (for example, silicon) substrate 12 in which integrated circuit devices, such as transistors 14, have been formed. The deposition of the layer 10 is conformal, so the upper (top) surface 16 of the layer 10 will not be planar due to the presence of the underlying integrated circuit device structures. The layer 10 is used in the formation of a pre-metallization dielectric (PMD) layer for the integrated circuit. It is critical for subsequent steps in the fabrication process for the upper (top) surface of the PMD layer to be planar. In order to achieve planarity, it is common to perform a chemical mechanical polishing (CMP) on the layer 10 to provide for the desired degree of planarity for the upper surface 16' with a result as shown in FIG. 1B.

In some integrated circuits, the PMD layer is formed by a coupled dielectric oxide layer. To achieve this structure, a trench 20 is formed in the planarized layer 10. The trench 20 may have any suitable depth, and in a typical implementation extends down to the upper surface of the semiconductor substrate 12 as shown in FIG. 1C. A deposition is then made of a layer 22 of a dielectric material (for example, an oxide, but different from the oxide of the layer 10) over the layer 10 and filling the trench 20. The deposition of the layer 22 is conformal, so the upper (top) surface 26 of the layer 22 will not be planar due to the presence of the underlying layer 10 and trench 20. See, FIG. 1D. The layers 10 and 22 are used in the formation of the pre-metallization dielectric (PMD) layer for the integrated circuit with a coupled dielectric oxide configuration. It is critical for subsequent steps in the fabrication process for the upper (top) surface of the PMD layer to be planar. In order to achieve planarity, chemical mechanical polishing (CMP) is performed on the layer 22, with the CMP ideally stopping on the layer 10 to form a planar top surface for the PMD layer. However, the CMP becomes unstable when reaching the vertically extending interface 28 for the coupled dielectric between the layers 10 and 22 at the trench 20. This occurs because the layers 10 and 22 are made of different oxide materials which have significantly different polish rates. For example, if the oxide material for the layer 10 is Borophosphosilicate Tetraethyl Orthosilicate (BPTEOS) and the oxide material for the layer 22 is Tetraethyl Orthosilicate (TEOS), the polish rate for the layer 10 can be almost double the polish rate for the layer 22. As a result, a not insignificant difference in thickness exists between the portion of the PMD layer formed by layer 10 and the portion of the PMD layer formed by layer 22, with an overall non-planar top surface 26' present, and a non-uniformity 26" (with possible dishing 27) in the planarity of top surface with respect to the portion of the PMD layer formed by layer 10 may also be present, as shown in FIG. 1E.

There is accordingly a need in the art to provide a fabrication process which can achieve of a planar top surface after CMP with respect to the making of a PMD layer formed by a coupled dielectric oxide layer.

SUMMARY

In an embodiment, a method comprises: depositing a first dielectric layer made of a first dielectric material; depositing a buffer layer on an upper surface of the first dielectric layer; opening a trench which extends through the buffer layer and the first dielectric layer; depositing a second dielectric layer made of a second dielectric material in a conformal manner on the buffer layer and filling the trench; performing a chemical mechanical polish of the second dielectric layer, with the chemical mechanical polish using the buffer layer as a polish stop; and removing the buffer layer so that the first dielectric layer and the second dielectric material filling the trench form a pre-metallization dielectric layer having a substantially planar upper surface.

The buffer layer protects the first dielectric material from being eroded by the chemical mechanical polish so as to support achieving surface planarity of the pre-metallization dielectric layer across the vertically extending interface for the coupled dielectric structure formed by the first dielectric layer and the second dielectric material filling the trench.

The method further comprises: forming a first metal contact extending through the second dielectric material in the trench to an upper surface of an underlying semiconductor substrate; and forming a second metal contact extending through the first dielectric material to an integrated circuit device supported by the underlying semiconductor substrate.

The method further comprises: forming an aperture extending through the second dielectric material in the trench to an upper surface of an underlying semiconductor substrate in order to expose a microelectromechanical system (MEMS) device.

BRIEF DESCRIPTION OF THE DRAWINGS

For a better understanding of the embodiments, reference will now be made by way of example only to the accompanying figures in which.

DETAILED DESCRIPTION

Figure 1A:
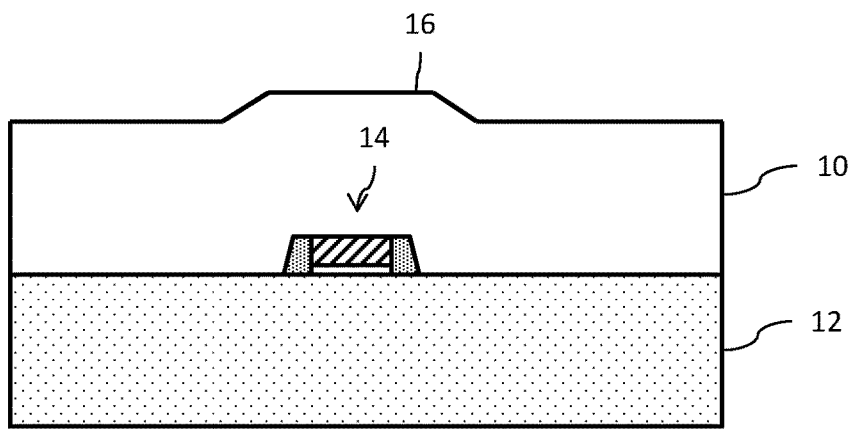
FIGS. 1A-1E illustrate a prior art process for formation of a pre-metallization dielectric (PMD) layer.
Figure 1B:
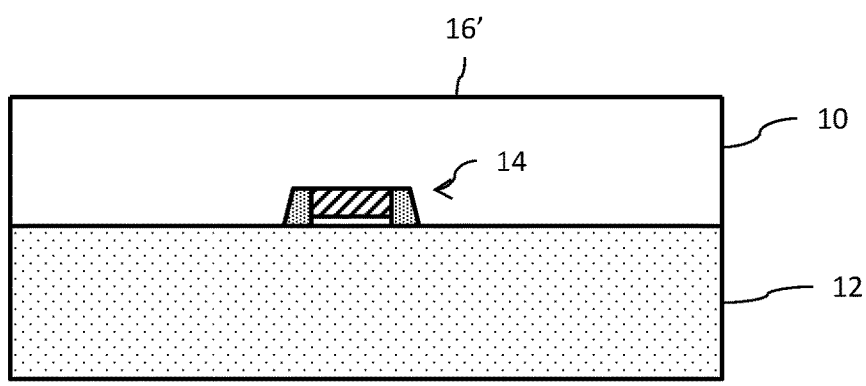
Figure 1C:
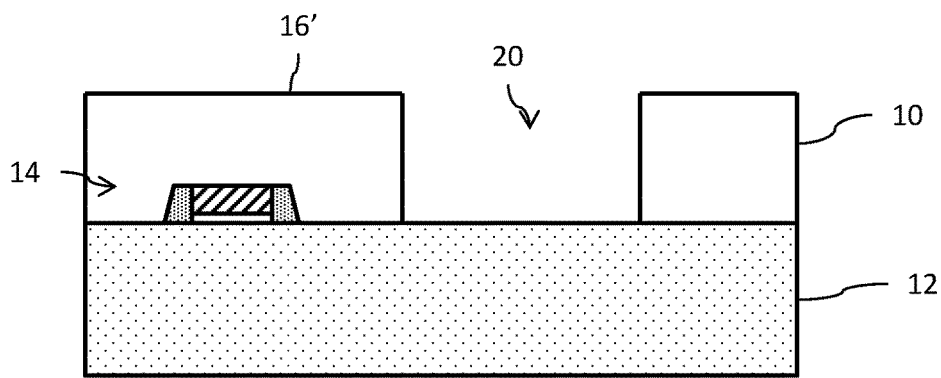
Figure 1D:
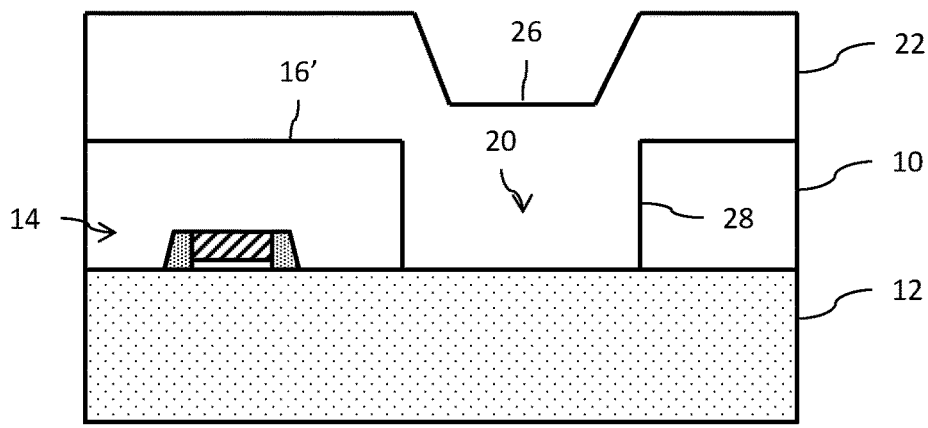

Reference is now made to FIGS. 2A-2H which illustrate a process for formation of a pre-metallization dielectric (PMD) layer including a coupled dielectric oxide layer.

A semiconductor (for example, silicon) substrate 112 supports integrated circuit devices, such as transistors 114. A layer 120 of undoped Silicon glass (USG) is deposited over the circuit devices and the substrate 112 and planarized using a chemical mechanical polish (CMP). A layer 122 of a first dielectric oxide material is deposited over the layer 120 and planarized using a chemical mechanical polish (CMP) to provide a planar top surface 126. In an embodiment, the first dielectric oxide material is Borophosphosilicate Tetraethyl Orthosilicate (BPTEOS). See, FIG. 2A.

Next, a layer 130 of a buffer material is deposited on the planar top surface 126 of the layer 122. The material used for the buffer layer 130 should exhibit a significant selectivity difference to the slurry used during chemical mechanical polishing. In an embodiment, the buffer material for the layer 130 may comprise Silicon Nitride (SiN). Alternatively, the buffer layer may comprise Silicon Carbon Nitride (SiCN) or Hydrogen-containing Silicon-Oxy-Carbide (SiCOH). Still further, a metal and/or metal nitride barrier layer material could be used for the buffer layer 130. Examples of this include a Titanium/Titanium Nitride barrier or a Tantalum/Tantalum Nitride barrier. Then, a lithographically patterned mask 132 is formed on the top surface of the layer 130. The mask 132 has a mask opening 134. See, FIG. 2B.

Figure 2A:
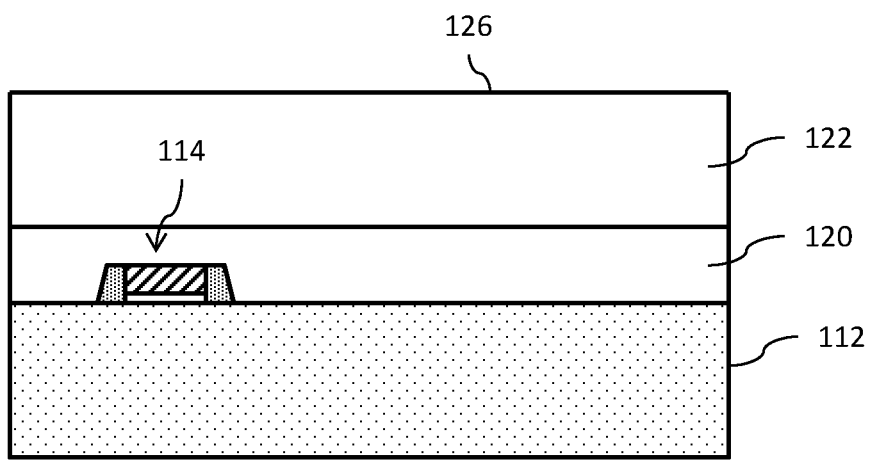
FIGS. 2A-2H illustrate a process for formation of a pre-metallization dielectric (PMD) layer including a coupled dielectric oxide layer.
Figure 2B:
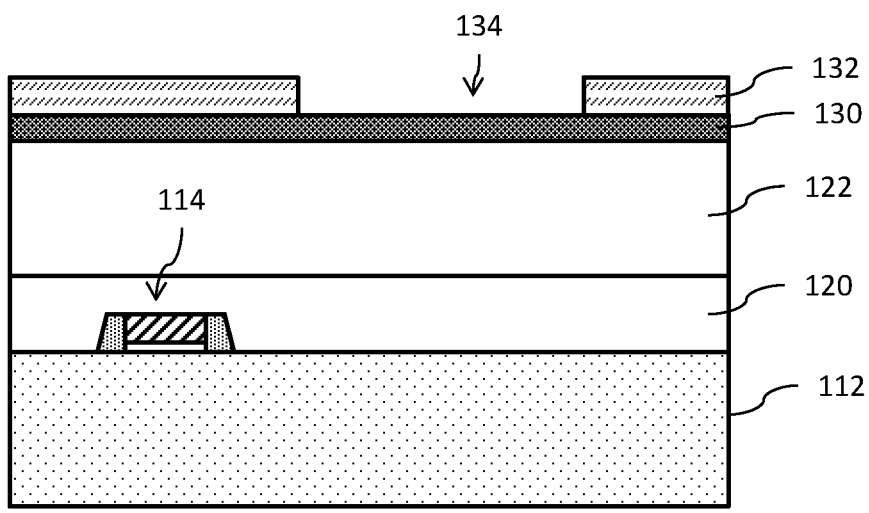
Figure 2C:
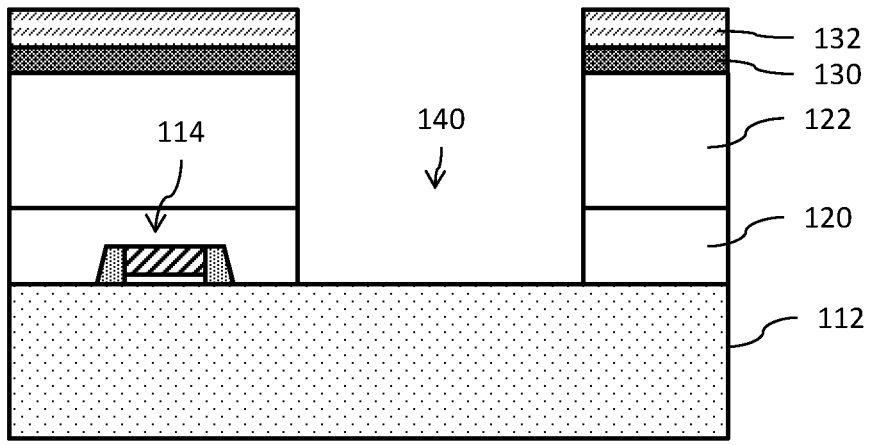
Figure 2D:
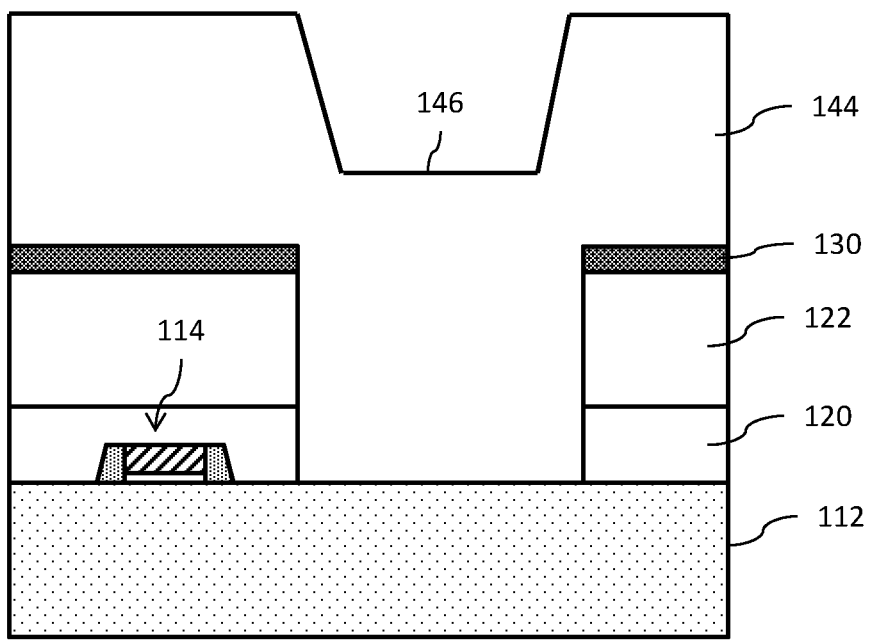

An etching process is then performed through the mask opening 132 to open a trench 140 in the layers 120, 122 and 130. The trench 140 may, for example, have dimensions, in a plane parallel to the upper surface of the substrate, defined by a width in the range of hundreds of micrometers (for example, about 100 µm) and a length in the range of tens of millimeters (for example, about 20 mm). In a preferred implementation, the trench 140 extends completely through the layers 120, 122 and 130 to reach the upper surface of the semiconductor substrate 112. The result is shown in FIG. 2C. The etching process may, for example, be performed in multiple etch steps including a first etch to remove the portion of the layer 130, a second step to remove the layers 120 and 122 and a third etch to then remove structures (not shown) located between the bottom of layer 120 and the upper surface of the semiconductor substrate 112. The first etch may, in such a case, comprise an etch tailored to break through the buffer layer 130, the second etch may, in such a case, comprise an etch tailored to remove the materials of layers 120 and 122, and the third etch may, in such a case, comprise an etch tailored to remove the underlying structures. Suitable cleaning operations may be performed after each etch. It will also be understood that the second and third etches may use the remaining portions of the buffer layer 130 as the hard mask, in which case the mask 132 may be stripped during the clean performed following the first etch.

A layer 144 of a second dielectric oxide material, different from the first dielectric oxide material, is then deposited over the buffer layer 130 and filling the trench 144. The deposition of the layer 144 is conformal, so the upper (top) surface 146 of the layer 144 will not be planar due to the presence of the underlying layers and the trench 140. In an embodiment, the second dielectric oxide material is Tetraethyl Orthosilicate (TEOS). See, FIG. 2D.

In an embodiment, the first and second dielectric oxide materials are different forms of a Silicon Oxide. For example, the two Silicon Oxides may be differently doped, including the possibility for one being doped and the other being undoped. The choice of dielectric oxide material may, for example, depend on the dielectric characteristics of the material selected based on the use being made of the material at the particular location on the substrate 112.

Figure 2E:
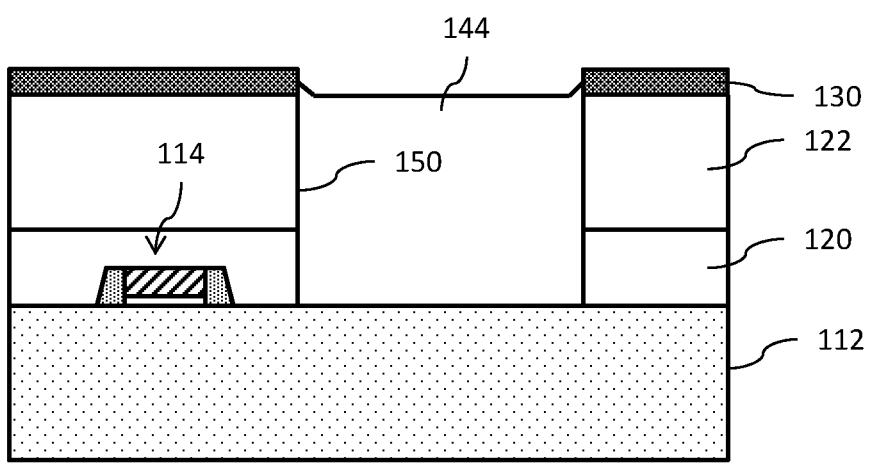

The layers 120, 122 and 144 are used in the formation of the pre-metallization dielectric (PMD) layer for the integrated circuit. It is critical for subsequent steps in the fabrication process for the upper (top) surface of the PMD layer to be planar. In order to achieve planarity, chemical mechanical polishing (CMP) is performed on the layer 144, with the CMP stopping on the buffer 130. The result is shown in FIG. 2E, with the upper surface of the layer 144 in the trench 140 being generally co-planar with the upper surface of the layer 122. It will be noted that there is some non-uniformity (such as dishing) with the second dielectric material at and/or near the vertically extending interface 150 for the coupled dielectric between the layers 120/122 and the layer 144 at the trench 140, but the buffer layer 130 has successfully functioned to inhibit erosion of the first dielectric material at the location of the interface 150 so as to preserve the likelihood of achieving a planar upper surface.

Figure 2F:
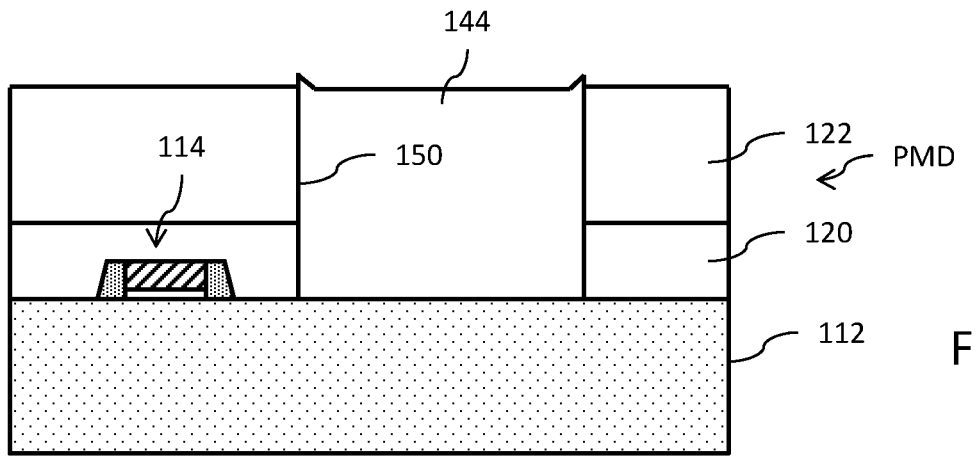
Figure 2G:
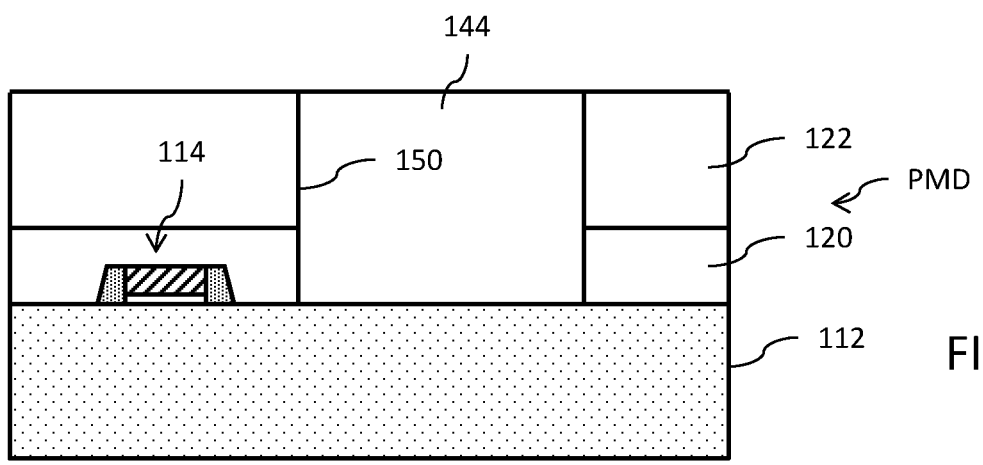

The buffer layer 130 is then removed. For example, a dry etch selective to the material of the buffer layer 130 may be used. A suitable cleaning operation may be performed after the etch. The result is shown in FIG. 2F. Advantageously, the removal of the buffer layer 130 after CMP is completed permits the planar surface of the PMD layer to be achieved without introducing additional film layers in the final stacks of layers for the fabricated integrated circuit.

Figure 1E:
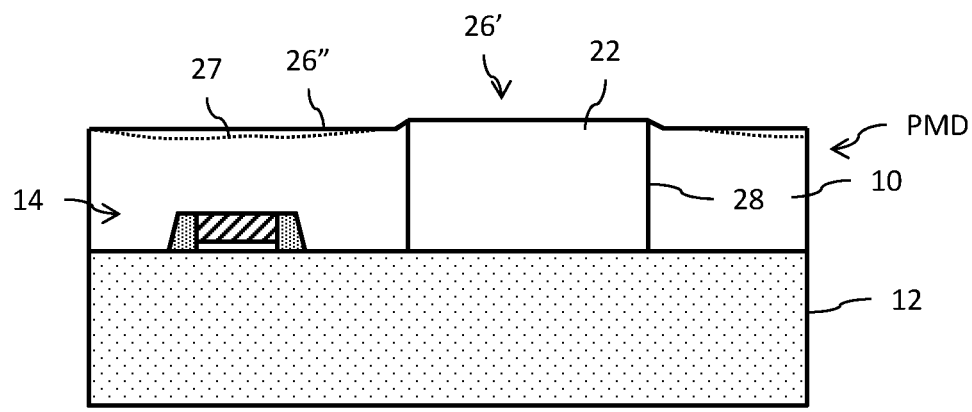

It will be noted that there is a substantially uniform thickness exhibited by the portion with layers 120/122 and the remaining portion of layer 144 filling the trench 140. For example, in an implementation of the foregoing process the PMD layer exhibited a difference in thickness between the portion with layers 120/122 and the remaining portion of layer 144 of 700 Å to 1100 Å (with a standard deviation of 200 Å, about 1.4%) compared to a difference of about 3400 Å (with a standard deviation of about 800 Å, about 5.5%) when the buffer layer 130 is not used (see, FIG. 1E).

If the remaining non-uniformity at and/or near the vertically extending interface 150 is acceptable, the process for forming the PMD layer ends. Alternatively, a further over-polishing is performed to finish planarization of the top surface of the PMD layer, with a result shown in FIG. 2G.

Figure 2H:
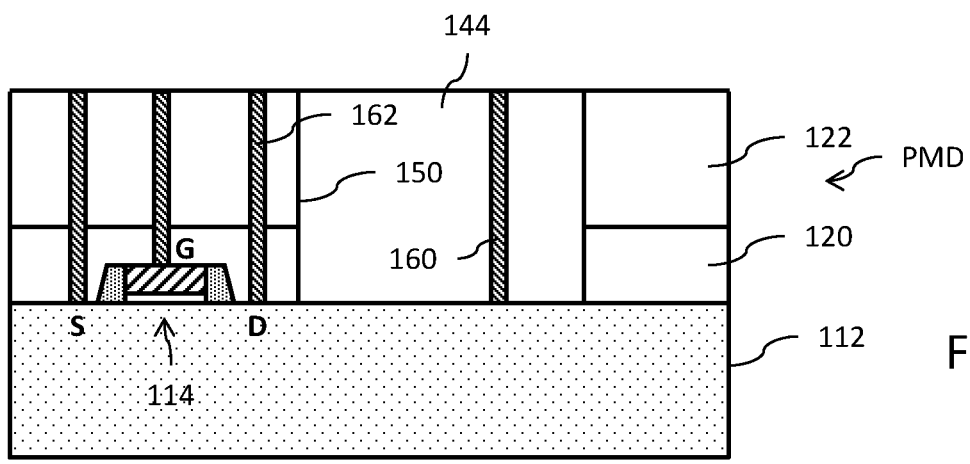

Subsequent front end of line (FEOL) processing for forming metal contacts in the PMD layer to reach the integrated circuit devices is then performed in a manner well known to those skilled in the art. As an example of this, FIG. 2H shows the formation of a metal contact 160 extending through the portion of layer 144 in the trench 140 to make contact with the substrate 112 and the formation of metal contacts 162 extending through the portion of layers 120 and 122 outside the trench 140 to make contact with the source (S), drain (D) and gate (G) of the transistor 114. The contact metal may, for example, be made of Tungsten and the contact may further include an appropriate liner material if necessary.

Conventional back end of line (BEOL) processing for forming metallization layers is then performed over the PMD layer in a manner well known to those skilled in the art.

Figure 3:
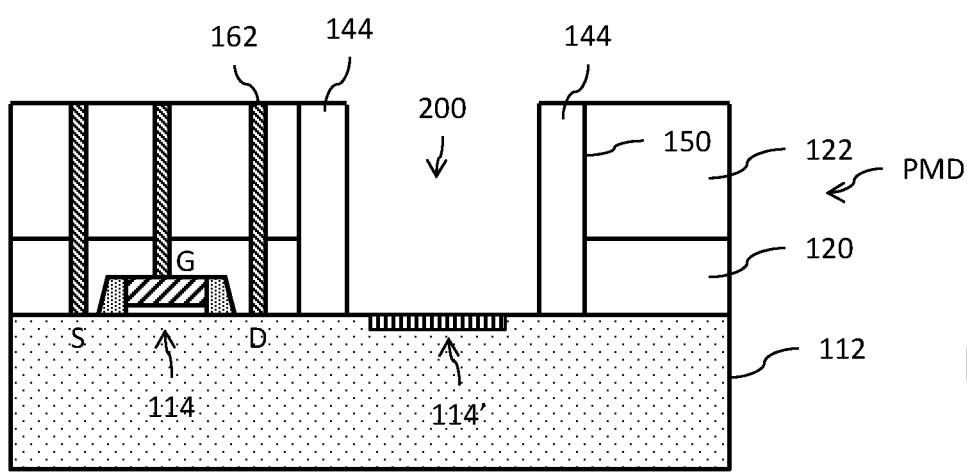
FIG. 3 illustrates a further step of the process for forming an aperture extending through the PMD layer to expose the underlying substrate and a microelectromechanical system (MEMS) device.

In some implementations, further processing may include the opening of an aperture 200 extending through the portion of layer 144 in the trench 140 to reach the substrate 112. This aperture 200 is used to expose an integrated circuit device 114' to the external environment. This is useful in an application where the integrated circuit device 114' is a microelectromechanical system (MEMS) device operating as a fluid flow device (such as for use in printing applications) or operating as a sensing device (such as for use in a gas detector). See, FIG. 3.

An etching process controlled by a mask is used for forming the aperture 200. The aperture 200 will have dimensions, in a plane parallel to the upper surface of the substrate, defined by a width and length smaller than the width and length of the trench 140. Thus, in a preferred implementation, the second dielectric oxide material for the layer 144 in the trench 140 will completely surround the aperture 200. The etching process may, for example, be performed in a single etch step to remove a portion of the material of layer 144 which remains in the trench 140. The etch is tailored to remove the material of layers 144. Suitable cleaning operations may be performed after the etch.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method, comprising:
   depositing a first dielectric layer made of a first dielectric material;
   depositing a buffer layer on an upper surface of the first dielectric layer;
   opening a trench which extends through the buffer layer and the first dielectric layer;
   depositing a second dielectric layer made of a second dielectric material in a conformal manner on the buffer layer and filling the trench;
   performing a chemical mechanical polish of the second dielectric layer, with the chemical mechanical polish using the buffer layer as a polish stop; and
   removing the buffer layer so that the first dielectric layer and the second dielectric material filling the trench form a pre-metallization dielectric layer having a substantially planar upper surface.

2. The method of claim 1, wherein opening the trench comprises performing an etching process.

3. The method of claim 2, wherein the etching process comprises:
   an etch to break through the buffer layer; and
   an etch to remove a portion of the first dielectric material.

4. The method of claim 3, wherein the etch to break through the buffer layer uses a mask deposited over the buffer layer, and wherein the etch to remove the portion of the first dielectric material uses the buffer layer as a mask.

5. The method of claim 1, further comprising performing an overpolish after removing the buffer layer in order to improve planarization of the upper surface of the pre-metallization dielectric layer.

6. The method of claim 1, further comprising forming a metal contact extending through the second dielectric material in the trench to an upper surface of an underlying semiconductor substrate.

7. The method of claim 1, further comprising forming a metal contact extending through the first dielectric material to an integrated circuit device supported by an underlying semiconductor substrate.

8. The method of claim 7, wherein the integrated circuit device is a transistor.

9. The method of claim 1, wherein the buffer layer is a made of a material selected from the group consisting of: Silicon Nitride (SiN); Silicon Carbon Nitride (SiCN) and Hydrogen-containing Silicon-Oxy-Carbide (SiCOH).

10. The method of claim 1, wherein the buffer layer is a made of a metal-nitride material selected from the group consisting of: Tantalum Nitride and Titanium Nitride.

11. The method of claim 1, wherein the buffer layer is a made of a material selected from the group consisting of: Tantalum and Titanium.

12. The method of claim 1, wherein the first dielectric material is a first form of Tetraethyl Orthosilicate (TEOS) and the second dielectric material is a second form of Tetraethyl Orthosilicate (TEOS).

13. The method of claim 12, wherein the first form is Borophosphosilicate Tetraethyl Orthosilicate (BPTEOS) and where the second form is Tetraethyl Orthosilicate (TEOS).

14. The method of claim 1, wherein the first dielectric material is a first form of Silicon Oxide and the second dielectric material is a second form of Silicon Oxide different from the first form.

15. The method of claim 1, wherein the second dielectric material filling the trench and the first dielectric material of the first dielectric layer form, at a sidewall of the trench, a contact interface for a coupled dielectric of the pre-metallization dielectric layer.

16. The method of claim 15, wherein the buffer layer inhibits erosion of the first dielectric material at the contact interface while performing the chemical mechanical polish.

17. The method of claim 1, further comprising forming an aperture which extends through the second dielectric material filling the trench to an upper surface of an underlying semiconductor substrate.

18. The method of claim 17, where forming the aperture comprises performing an etching process.

19. The method of claim 17, wherein the aperture exposes a microelectromechanical system (MEMS) device supported by the underlying semiconductor substrate.

20. The method of claim 19, wherein the MEMS device is a sensor.

21. The method of claim 19, wherein the MEMS device is a fluid flow device.

22. The method of claim 17, wherein portions of the second dielectric material which remain after forming the aperture completely surround the aperture.

23. The method of claim 1, wherein depositing the first dielectric layer comprises depositing said first dielectric layer over a Silicon glass layer that covers electronic circuits formed at an upper surface of a semiconductor substrate; and wherein opening the trench comprises opening said trench to extend through the buffer layer, the first dielectric layer and the Silicon glass layer to reach the upper surface of the semiconductor substrate.

24. The method of claim 23, wherein opening the trench comprises performing an etching process.

25. The method of claim 24, wherein the etching process comprises:
   an etch to break through the buffer layer;
   an etch to remove a portion of the first dielectric material; and
   an etch to remove a portion of the Silicon glass layer.

* * * * *